(12) United States Patent
Stultz et al.

(10) Patent No.: US 8,699,717 B2
(45) Date of Patent: Apr. 15, 2014

(54) AUDIO AMPLIFIER PERFORMANCE WHILE MAINTAINING USB COMPLIANCE AND POWER DOWN PROTECTION

(75) Inventors: Julie Lynn Stultz, Scarborough, ME (US); Earl Schreyer, Carlsbad, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 620 days.

(21) Appl. No.: 12/790,122

(22) Filed: May 28, 2010

(65) Prior Publication Data

US 2011/0293100 A1 Dec. 1, 2011

(51) Int. Cl.
*H04R 5/00* (2006.01)
(52) U.S. Cl.
USPC ............................................. 381/28; 381/93
(58) Field of Classification Search
USPC .............. 381/28, 120, 123; 330/151, 251, 10, 330/207 R, 207 A; 700/94
See application file for complete search history.

(56) References Cited

U.S. PATENT DOCUMENTS

| | | | |
|---|---|---|---|
| 6,163,199 A | | 12/2000 | Miske et al. |
| 6,324,230 B1 * | | 11/2001 | Graham et al. ............... 375/345 |
| 2001/0003166 A1 * | | 6/2001 | Gulick ............................ 700/94 |
| 2003/0201824 A1 * | | 10/2003 | Ramesh et al. .................... 330/9 |
| 2011/0267731 A1 * | | 11/2011 | Amadi et al. ................. 361/93.1 |

FOREIGN PATENT DOCUMENTS

JP 59074712 * 4/1984 ............. H03F 3/217
KR 102011013110 12/2011

OTHER PUBLICATIONS

"FSA2000—Auto-Selecting HS-USB Switch with Cap-Free Headphone Audio Amplifier", Fairchild Semiconductor, (Mar. 2010), 2 pgs.*

* cited by examiner

*Primary Examiner* — Lun-See Lao
(74) *Attorney, Agent, or Firm* — Schwegman, Lundberg & Woessner, P.A.

(57) ABSTRACT

An apparatus comprises a first audio amplifier circuit configured to provide an analog audio signal and an analog switch circuit including a first input configured to receive the analog audio signal, a second input configured to receive a first digital data signal, and a first output configured to provide one of the digital data signal or the analog audio signal. The apparatus also includes a first feedback circuit coupled to the first audio amplifier circuit and the analog switch circuit output, the feedback circuit configured to bias the first audio amplifier circuit.

14 Claims, 4 Drawing Sheets

AUDIO AMPLIFIER PERFORMANCE WHILE MAINTAINING USB COMPLIANCE AND POWER DOWN PROTECTION

BACKGROUND

Personal electronic devices include MP3 portable media players, cellular phones, and smart phones. Popularity of the devices stems in part from the functionality they provide despite their small size. It is desirable to continue to provide more functionality in such devices even though it is desired to keep the devices at their same small size or to make them even smaller.

OVERVIEW

This document relates generally to electronic devices, and more specifically to providing combined audio and data capability in portable electronic devices. In example 1, an apparatus includes a first audio amplifier circuit configured to provide an analog audio signal, and an analog switch circuit. The analog switch circuit includes a first input configured to receive the analog audio signal, a second input configured to receive a first digital data signal, and a first output configured to provide one of the digital data signal or the analog audio signal. The apparatus also includes a first feedback circuit coupled to the first audio amplifier circuit and the analog switch circuit output. The feedback circuit is configured to bias the first audio amplifier circuit.

In example 2, the apparatus of example 1 optionally includes a second audio amplifier circuit. The first audio amplifier circuit and the second audio amplifier circuit optionally provide analog audio signals for right and left audio channels. The analog switch circuit includes a third input communicatively coupled to an output of the second audio amplifier circuit, a fourth input configured to receive a second digital data signal, and a second output, wherein the first and second outputs provide one of the first and second data signals or the analog audio signals for right and left audio channels. The apparatus of example 1 optionally includes a second feedback circuit communicatively coupled to the second audio amplifier circuit and the second analog switch circuit output. The second feedback circuit is configured to bias the second audio amplifier circuit.

In example 3, the first data signal and the second data signal of example 2 optionally form a complementary digital signal pair.

In example 4, the apparatus of any one of claims 1-3 optionally includes a communication port communicatively coupled to the analog circuit switch output.

In example 5, the communication port of example 4 optionally includes a universal serial bus (USB) port.

In example 6, the analog circuit switch of any one of examples 4 and 5 optionally includes a select input, wherein a change of state of the select input changes the communication port between a digital data mode and an analog audio mode.

In example 7, the feedback circuit of any one of examples 4-6 optionally includes a second switch circuit communicatively coupled to the communication port and configured to disconnect the feedback circuit path from the communication port when the analog switch circuit provides the digital data signal.

In example 8, the apparatus of example 7 optionally includes a pseudo voltage supply circuit. The pseudo voltage supply circuit is configured to derive a pseudo-voltage supply from a connector of the communication port and provide the pseudo-voltage supply to the analog switch circuit and the second switch circuit.

In example 9, the second switch circuit of any one of examples 7 and 8 optionally includes a complementary metal oxide (CMOS) pass-gate circuit. The pseudo-voltage supply is provided to the pass-gate circuit when the analog switch circuit provides the analog audio signal to the communication port.

In example 10, a method includes multiplexing, with a multiplexing circuit, one of a first electrical digital data signal and a first electrical analog audio signal to a connector of a communication port, and incorporating the multiplexing circuit in a first feedback circuit path used to bias an audio amplifier circuit that generates the first analog audio signal.

In example 11, the multiplexing of example 10 optionally includes multiplexing the first digital data signal and the first analog audio signal to a connector of a digital data port.

In example 12, the method any one of examples 10 and 11 optionally includes connecting the first feedback circuit path when providing the first analog audio signal to the connector of the communication port and disconnecting the feedback circuit path when providing the first digital data signal to the connector of the communication port.

In example 13, the multiplexing of any one of examples 10-12 optionally includes multiplexing one of a second electrical digital data signal and a second electrical analog audio signal to a second connector of a communication port. The incorporating the multiplexing circuit of examples 10-12 optionally includes incorporating the multiplexing circuit in a second feedback circuit path used to bias a second audio amplifier circuit that generates the second analog audio signal. The first and second digital data signals are optionally a complementary digital signal pair, and the first and second analog audio signals optionally correspond to right and left audio channels.

In example 14, the communication port of any one of example 10-13 optionally includes a USB port. The multiplexing of the examples optionally includes multiplexing the complementary digital signal pair to connectors of the communication port when the communication port operates in USB mode and multiplexing the right and left audio channels to the connectors of the communication port when operating the USB port in an audio mode.

In example 15, an integrated circuit (IC) includes a first IC output, a first audio amplifier circuit configured to provide an analog audio signal, and an analog multiplexer (mux) circuit. The analog mux circuit includes a first input configured to receive the analog audio signal, a second input configured to receive a first digital data signal, and a first output configured to provide one of the first digital data signal or the analog audio signal to the first IC output. The IC optionally includes a first feedback circuit path from the analog mux circuit output to an input of the first audio amplifier circuit, wherein the feedback circuit is configured to bias the first audio amplifier circuit.

In example 16, the first IC output of example 15 is optionally configured to be communicatively coupled to a digital data port.

In example 17, the first digital data signal of any one of examples 15 and 16 optionally complies with a digital data port communication protocol. The analog mux circuit of the examples optionally includes a select input and the first analog mux circuit output is optionally configured to provide one of the analog audio signal or the communication protocol compliant digital data signal at the first mux output according to a state of the select input.

In example 18, the IC of anyone of examples 15-17 optionally includes a second IC output and a second audio amplifier circuit. The first audio amplifier circuit and the second audio amplifier circuit optionally provide analog audio signals for right and left audio channels. The analog mux circuit of the examples optionally includes a third input communicatively coupled to an output of the second audio amplifier circuit, a fourth input to receive a second digital data signal, and a select input. The first digital data signal and the second digital data signal are optionally a complementary data signal pair. The second output is optionally communicatively coupled to the second IC output, and the first and second analog mux circuit outputs provide one of the complementary data signal pair or the analog audio signals for the right and left audio channels to the first and second IC outputs according to the state of the select input. The IC further optionally includes a second feedback circuit path from the second analog mux circuit output to an input of the second audio amplifier circuit.

In example 19, the feedback circuit path of any one of examples 15-18 optionally includes a switch circuit communicatively coupled to the first IC output. The switch circuit is optionally configured to disconnect the feedback circuit path from the first IC output when the analog mux circuit provides the digital data signal to the first IC output and connect the feedback circuit path and provide the audio signal to operate in an audio mode.

In example 20, a first voltage supply circuit is applied to the first audio amplifier circuit of any one of examples 15-19. A second voltage supply circuit is optionally applied to the switch circuit to connect the feedback circuit path to the first IC output when the analog mux circuit provides the analog audio signal to the first IC output.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

This document relates generally to electronic devices and in particular, to incorporating audio capability into a digital data port. As explained above, it is desired to improve functionality of portable electronic devices despite the pressure to provide the functionality in a small device size.

The ability to reduce the size of a device is typically limited by the physical size of the user interfaces it includes. For example, a portable electronic device may be limited by the physical size of a display, keypad, or device ports. One way to provide the functionality in a small device size is to increase the functionality of the remaining device interfaces.

Figure 1:
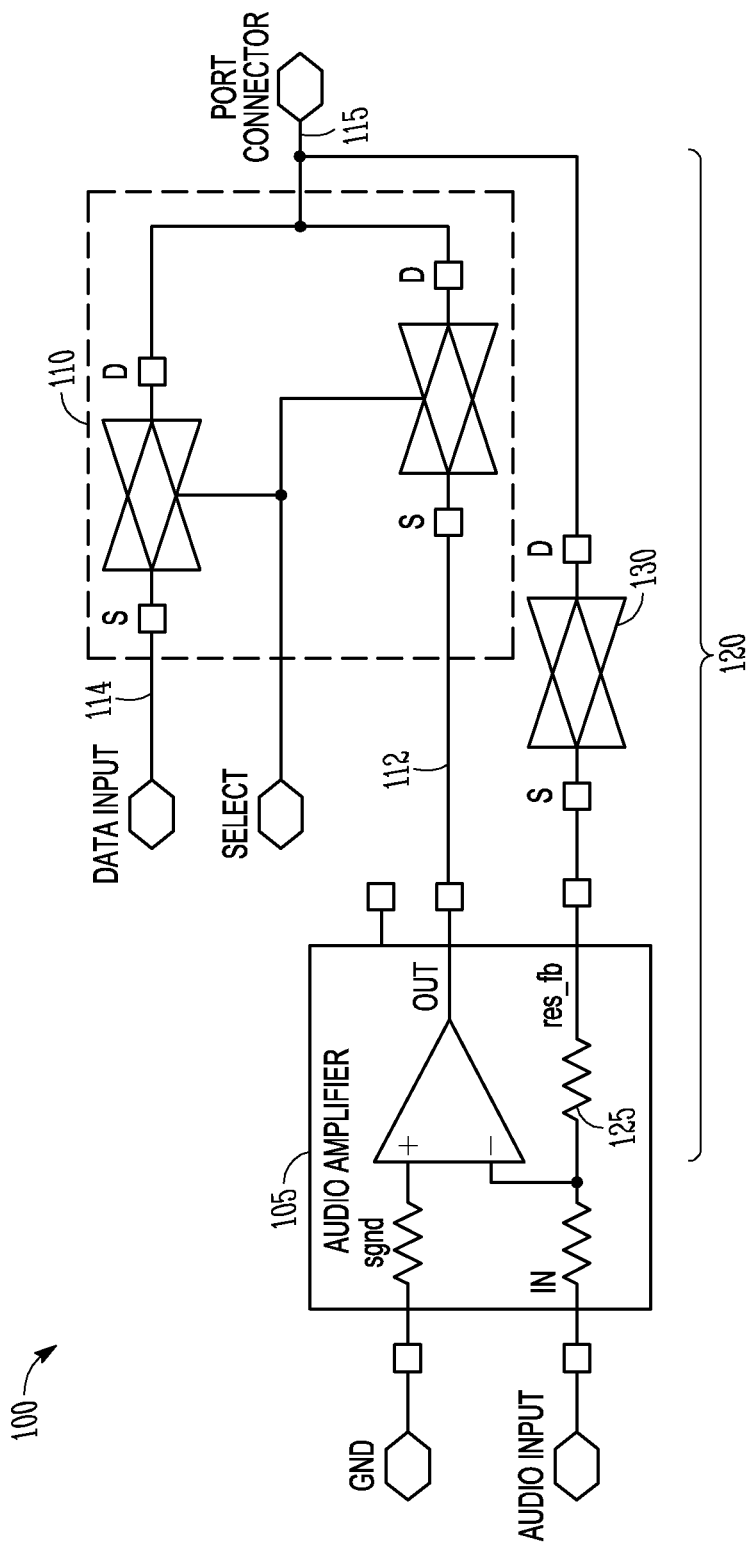
FIG. 1 is a block diagram of portions of an example of a device to provide both data and audio to a single port.

FIG. 1 is a block diagram of portions of an example of a device 100 to provide both data and audio to a single port. The port can be a digital data port or a data communication port. Examples of a digital data port include, among other things, a universal serial bus (USB) port, a video data port, a camera data port, or a high definition multimedia interface (HDMI). The digital data for the port can be provided by a separate digital device or digital subsystem of the same device.

The device 100 includes an audio amplifier circuit 105. The audio amplifier circuit 105 provides an electrical audio analog signal. The audio analog signal is an amplified signal derived from an input to the audio amplifier circuit 105. The audio analog signal includes a frequency or frequencies in the audio range and the amplitude of the signal can vary to be any value between a maximum voltage and a minimum voltage.

The device 100 includes an analog switch circuit 110 in series with the output of the audio amplifier circuit and the port. The analog switch circuit 110 includes a first input 112 to receive the analog audio signal, a second input 114 to receive the digital data signal. The digital data signal complies with a communication protocol of the digital data port, such as a communication protocol for any of the data ports listed above for example.

The analog switch circuit 110 includes an output 115 to provide one of the digital data signal or the analog audio signal. The output 115 is able to provide continuous levels of output voltage of an analog signal in addition to the discrete levels of the digital data signal. The analog switch circuit 110 also provides isolation of the output 115 from the inputs. The analog switch circuit output 115 can be communicatively coupled to a port connector. The communicative coupling allows the analog switch circuit 110 to communicate signals to the port even though there may be intervening circuitry.

In some examples, the analog switch circuit 110 includes a multiplexer (mux) circuit. Multiplexing the analog audio signal and the digital data signal allows use of the digital data port as both a data port and an audio port. In some examples, the analog circuit switch includes a select input. A change of state of the select input (e.g., low to high, or inactive to active) changes the mode of the communication port between a digital data mode and an analog audio mode. For example, the port connector may a pin connector designated as a data pin connector for a USB port. A speaker (e.g., a set of headphones) could be connected to the USB port with a USB connector, and audio signals could be provided to the speaker via the data pin. The select input changes the USB port mode between data and audio. In some examples, the presence of the speaker connection is sensed by the device 100 (e.g., by a sensed impedance) and the select input is set to provide the audio mode.

The analog switch circuit 110 is able to isolate the audio amplifier circuit 105 from the port connector when providing a digital data signal to the port connector. Isolating the audio amplifier circuit 105 regulates the capacitance seen at the port when data is transmitted or received. Without the isolation, the capacitance seen at the port may become too great to ensure compliance with timing of the digital communication protocol used by the port.

Adding the analog switch circuit in series with the output of the audio amplifier circuit 105 and the port may have detrimental effects on the quality of the audio amplifier circuit 105 as seen at the port connector. This series arrangement may reduce the signal gain, the output power, and the total harmonic distortion (THD) of the performance of the audio amplifier circuit 105 seen at the port connector.

The analog switch circuit 110 also includes a feedback circuit 120 coupled to the audio amplifier circuit 105 and the analog switch circuit output 110. It can be seen in the Figure that the feedback circuit 120 includes a feedback loop incorporating the analog switch circuit 110 and the biasing impedance 125 of the audio amplifier circuit 105. The feedback circuit 120 incorporates the impedance of the analog switch circuit 110 to bias the audio amplifier circuit. By including the analog switch circuit 110 in the feedback path, the signal gain, the output power, and the THD of the audio amplifier circuit are all improved.

However, the feedback circuit 120 may increase the impedance seen at the port connector to the point where power down protection and data signal compliance with the port protocol may be compromised. In order to ensure protocol compliance and power down protection, the feedback circuit 120 includes a second switch circuit 130 communicatively coupled to the communication port and configured to disconnect the feedback circuit path from the communication port when the analog switch circuit 110 provides a digital data signal.

In some examples, the device is formed of multiple components on a printed circuit board. In some examples, the device is provided on an integrated circuit (IC). The output of the analog switch circuit 110 can be communicatively coupled to an IC output, and the IC output is communicatively coupled to a port connector.

Figure 2:
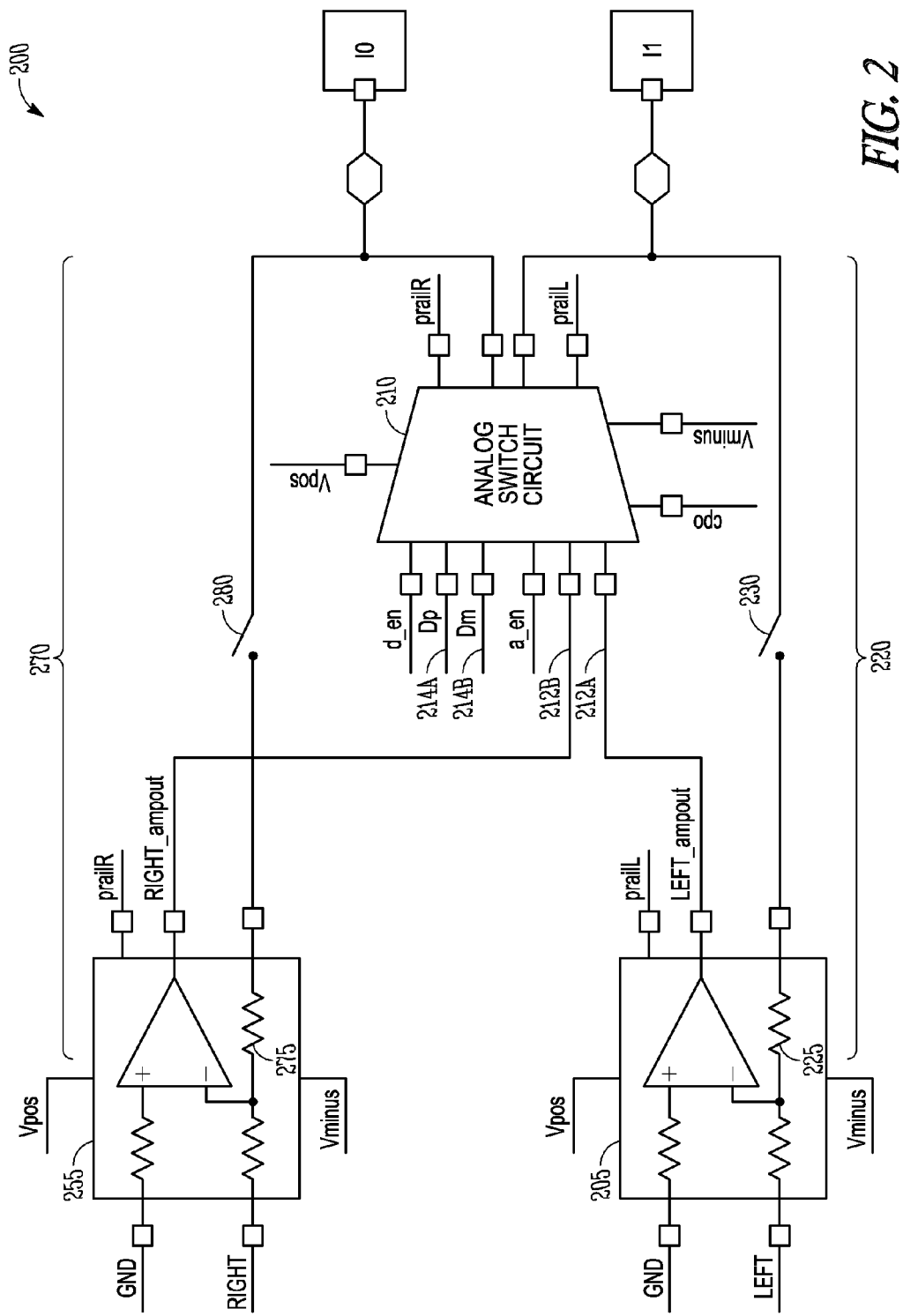
FIG. 2 is a block diagram of portions of an example of another device to provide both data and audio to a single port.

FIG. 2 is a block diagram of portions of an example of another device 200 to provide both data and audio to a single port. The device 200 includes a first audio amplifier circuit 205 and a second audio amplifier circuit 255. The outputs of audio amplifier circuits are provided to an analog switch circuit 210. The analog switch circuit 210 includes two inputs (212A, 212B) to receive an analog audio signal from each of the first and second audio amplifier circuits. In some examples, the first audio amplifier circuit 205 provides an analog audio signal corresponding to a left audio channel signal and the second audio amplifier circuit 255 provides an analog audio signal corresponding to a right audio channel signal. The left and right audio channels may provide stereo signals for a set of headphones.

The analog switch circuit 210 also includes two inputs (214A, 214B) to receive two digital data signals. In some examples, the first and second digital data signals are provided by a digital subsystem (not shown) included in the device 200.

The analog switch circuit also includes two outputs. In some examples, the outputs are communicatively coupled to two connectors of a communication port. In some examples, the device 200 is incorporated into an IC and the outputs are communicatively coupled to IC outputs (I0, I1 as shown). The IC outputs are then communicatively coupled to connectors of a communication port, such as a digital data port.

In some examples, the analog switch circuit 210 includes a select input. A change of state of the select input changes the signals at the outputs between the digital data signals (for a digital data mode) and the analog audio signals (for an analog audio mode). In some examples, the analog switch circuit 210 includes a separate analog enable (a_en) and a separate data enable (d_en) to provide one of the data signal pair or the analog signal pair at the output. In some examples, if neither the analog signals nor the digital data signals are enabled, the outputs of the analog switch are in a high impedance state. This may allow data signals to be received on the outputs and communicated to a digital data subsystem.

In some examples, the first data signal and the second data signal form a complementary digital signal pair, such as the complementary data signals (D+, D−) for a USB connector. The outputs of the complementary data signal pair or the analog audio signals for right and left audio channels are provided to the IC outputs and/or the communication port connectors according to the state of the select input (or the states of the enables).

The device 200 includes a first feedback circuit 220 communicatively coupled to the first audio amplifier circuit 205 and the first output of the analog switch circuit 210. The first feedback circuit 220 biases the first audio amplifier circuit 205 and includes a feedback loop incorporating the analog switch circuit 210 and the biasing impedance 225 of the first audio amplifier circuit 205. The device 200 also includes a second feedback circuit 270 communicatively coupled to the second audio amplifier circuit 255 and the second output of the analog switch circuit 210. The second feedback circuit 270 biases the first audio amplifier circuit 205 and includes a feedback loop incorporating the analog switch circuit 210 and the biasing impedance 275 of the second audio amplifier circuit 255.

Each of the feedback circuits also includes a switch circuit (230, 280) communicatively coupled between its analog circuit output and its audio amplifier input. The switches are configured to disconnect the feedback circuit paths from the device output when the analog switch circuit 210 provides the digital data signals and connect the feedback circuit paths when the analog switch circuit 210 provides the analog audio signals.

As explained previously, the disconnect switch circuit needs to disconnect its feedback circuit path from the external I/O pad or pin connection to ensure that the digital data signals comply with a communication protocol and to provide power down protection. To provide this protection, the disconnect switch circuits need to be supplied with a separate voltage supply rail, or a pseudo voltage supply rail.

FIG. 2 shows the pseudo voltage supply rail (prail) as generated by a pseudo voltage supply circuit in the analog switch circuit cell. The pseudo voltage supply rail provides power to the disconnect switch circuits when the circuit supply (Vcc) is 0V and a DC voltage is applied to the communication port. The pseudo voltage supply circuit derives a pseudo-voltage supply from a connector of the communication port and provides the pseudo-voltage supply to the analog switch circuit and the disconnect switch circuits. The voltage of the pseudo voltage supply rail may be greater than the circuit supply (Vcc). Using the pseudo voltage supply rail for the disconnect switches ensures that parasitic diodes will not forward bias when the communication port is stressed during power down. An approach for generating a pseudo voltage supply rail can be found in Miske et al., U.S. Pat. No. 6,163,199, "Overvoltage/Undervoltage Tolerant Transfer Gate," filed Jan. 29, 1999, which is incorporated herein by reference in its entirety.

Figure 3:
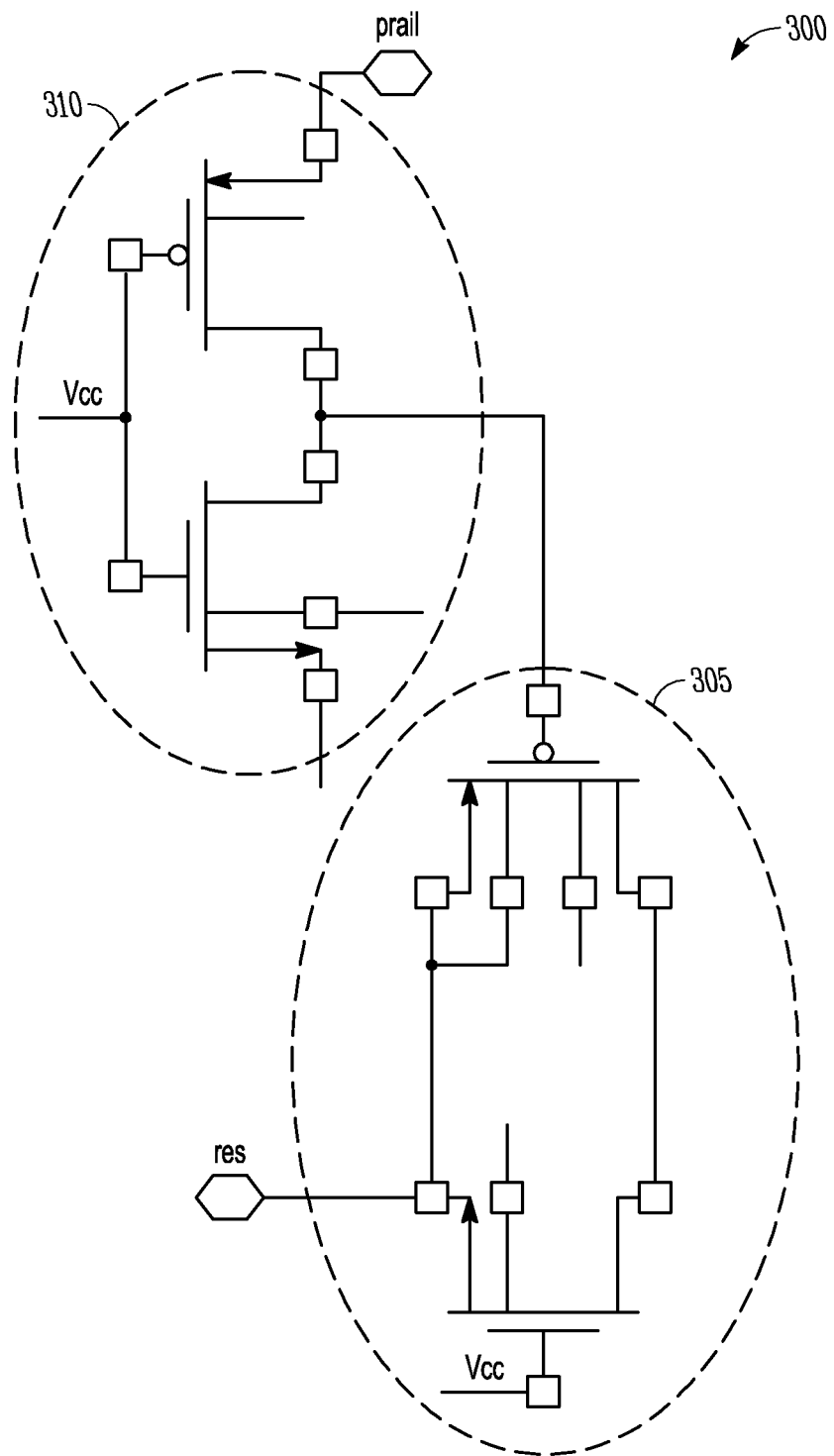
FIG. 3 is circuit schematic of an example of a disconnect switch circuit.

FIG. 3 is circuit schematic of an example of a disconnect switch circuit 300. The disconnect switch circuit 300 includes a complementary metal oxide (CMOS) pass-gate circuit 305.

In the Figure, when Vcc is 0V, the pseudo voltage supply rail, prail is provided by the inverter 310 to the PMOS transistor and 0V (Vcc) is provided to the NMOS transistor to deactivate or disconnect the pass-gate circuit 305. Thus, when Vcc=0V, prail is provided to the switch when the device is powered down or when it is desired to provide the data signals to the communication port. When Vcc is high, Vee (e.g., ground) is provided to the PMOS transistor and Vcc is provided to the NMOS transistor to activate the pass-gate circuit 305 and to connect the feedback circuit path.

Figure 4:
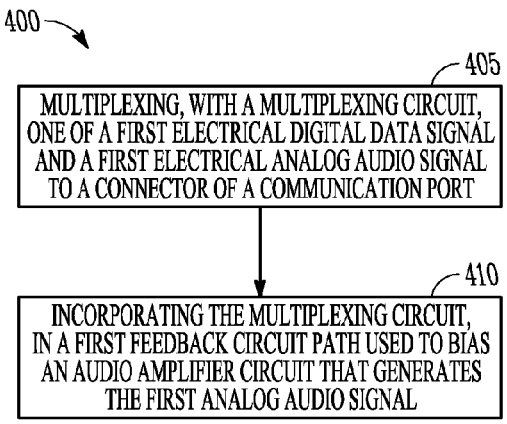
FIG. 4 is a flow diagram of an example of a method of providing combined audio and data capability using a digital data port.

FIG. 4 is a flow diagram of an example of a method 400 of providing combined audio and data capability with a digital data port. At block 405, one of a first electrical digital data signal and a first electrical analog audio signal are multiplexed to a connector of a communication port using a multiplexer circuit. In some examples, the multiplexing includes multiplexing the first digital data signal and the first analog audio signal to a connector of a digital data port.

At block 410, the multiplexing circuit is incorporated in a first feedback circuit path used to bias an audio amplifier circuit that generates the first analog audio signal.

In some examples, the method 400 includes connecting the first feedback circuit path when providing the first analog audio signal to the connector of the communication port and disconnecting the feedback circuit path when providing the first digital data signal to the connector of the communication port. As explained above, this is useful to maintain compliance of the data signals for the protocol of the digital data port. Having too great a capacitive load may result in having to run the port at too slow a speed.

According to some examples, the method 400 further includes multiplexing one of a second electrical digital data signal and a second electrical analog audio signal to a second connector of a communication port. In other words, either two digital data signals, or two analog audio signals are multiplexed to first and second connectors of the communication port. The multiplexing circuit is incorporated into a second feedback circuit path used to bias a second audio amplifier circuit that generates the second analog audio signal. Examples of the first and second feedback circuit paths are shown in FIG. 2.

In some examples, the first and second analog audio signals correspond to right and left audio channels to provide stereo audio signals to the communication port. In some examples, the first and second digital data signals are a complementary digital signal pair. As discussed previously, the communication port can include a USB port. Thus, the method can include multiplexing the complementary digital signal pair to connectors of the communication port when the communication port operates in USB mode and multiplexing the right and left audio channels to the connectors of the communication port when operating the USB port in an audio mode.

Figure 5:
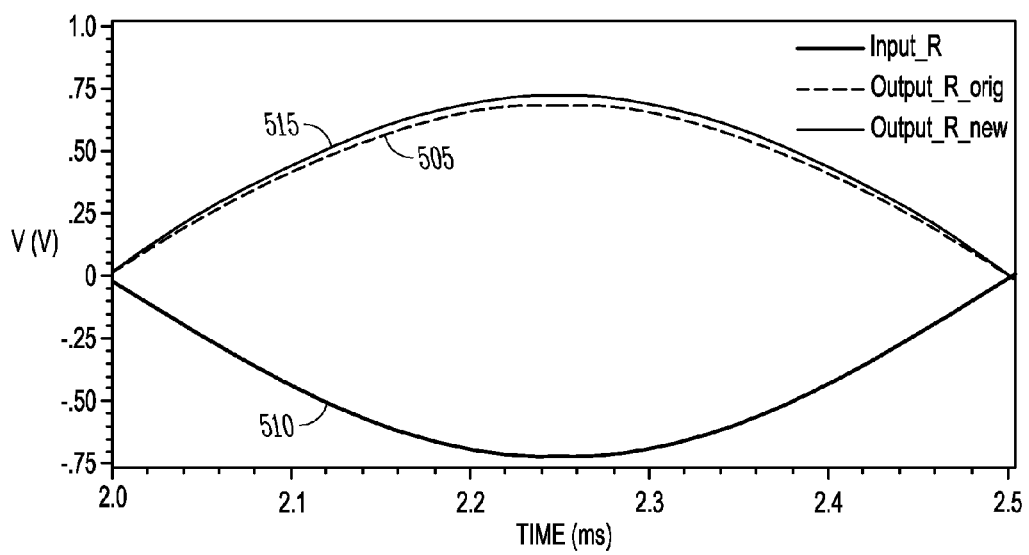
FIG. 5 shows a simulation of the analog signal seen at the output of an analog switch circuit.

Including a multiplexer circuit or an analog switch circuit in the feedback path used to bias the audio amplifiers can improve signal gain, output power, and THD of the audio circuit. FIG. 5 shows a simulation of the analog signal seen at the output of the analog switch circuit 110 of FIG. 1. The simulation includes an output analog signal 505 resulting from not including the analog switch circuit 110 to the feedback path used to bias the audio amplifier circuit 105. The simulation shows that the voltage amplitude of the output analog signal 505 is less than the input signal 510; resulting in a gain of −0.45 decibels (dB). The simulation also shows an output analog signal 515 with the impedance of the analog switch circuit 110 added to the feedback path that biases the audio amplifier circuit 105. The simulation shows that the voltage amplitude of the output analog signal 515 is slightly greater than the input signal 510; resulting in a gain of +0.009 dB.

Additional Notes

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An apparatus comprising:
   a first audio amplifier circuit configured to provide an analog audio signal, wherein the first audio amplifier circuit includes an input;
   an analog switch circuit including:
      a first input configured to receive the analog audio signal;
      a second input configured to receive a first digital data signal; and
      a first output configured to provide one of the digital data signal or the analog audio signal; and
   a first feedback circuit electrically coupled from the output of the analog switch circuit to the input of the first audio amplifier circuit, the feedback circuit configured to bias the first audio amplifier circuit.

2. The apparatus of claim 1, including:
a second audio amplifier circuit, wherein the first audio amplifier circuit and the second audio amplifier circuit provide analog audio signals for right and left audio channels,
wherein the analog switch circuit includes:
a third input communicatively coupled to an output of the second audio amplifier circuit;
a fourth input configured to receive a second digital data signal; and
a second output, wherein the first and second outputs provide one of the first and second data signals or the analog audio signals for right and left audio channels; and
a second feedback circuit communicatively coupled to the second audio amplifier circuit and the second analog switch circuit output, the second feedback circuit configured to bias the second audio amplifier circuit.

3. The apparatus of claim 2, wherein the first data signal and the second data signal form a complementary digital signal pair.

4. The apparatus of claim 1, including a communication port communicatively coupled to the analog circuit switch output.

5. The apparatus of claim 4, wherein the communication port includes a universal serial bus (USB) port.

6. The apparatus of claim 4, wherein the analog circuit switch includes a select input, wherein a change of state of the select input changes the communication port between a digital data mode and an analog audio mode.

7. The apparatus of claim 4, wherein the feedback circuit includes a second switch circuit communicatively coupled to the communication port and configured to disconnect the feedback circuit path from the communication port when the analog switch circuit provides the digital data signal.

8. The apparatus of claim 7, including a pseudo voltage supply circuit, wherein the pseudo voltage supply circuit is configured to derive a pseudo-voltage supply from a connector of the communication port and provide the pseudo-voltage supply to the analog switch circuit and the second switch circuit.

9. The apparatus of claim 8, wherein the second switch circuit includes a complementary metal oxide (CMOS) pass-gate circuit, and wherein the pseudo-voltage supply is provided to the pass-gate circuit when the analog switch circuit provides the analog audio signal to the communication port.

10. A method comprising:
multiplexing, with a multiplexing circuit, one of a first electrical digital data signal and a first electrical analog audio signal to a connector of a communication port; and
incorporating the multiplexing circuit in a first feedback circuit path used to bias an audio amplifier circuit that generates the first analog audio signal, wherein the first feedback circuit path extends from an output of the multiplexing circuit to an input of the audio amplifier circuit.

11. The method of claim 10, wherein the multiplexing includes multiplexing the first digital data signal and the first analog audio signal to a connector of a digital data port.

12. The method of claim 10, including connecting the first feedback circuit path when providing the first analog audio signal to the connector of the communication port and disconnecting the feedback circuit path when providing the first digital data signal to the connector of the communication port.

13. The method of claim 10,
wherein the multiplexing includes multiplexing one of a second electrical digital data signal and a second electrical analog audio signal to a second connector of a communication port,
wherein incorporating the multiplexing circuit includes incorporating the multiplexing circuit in a second feedback circuit path used to bias a second audio amplifier circuit that generates the second analog audio signal,
wherein the first and second digital data signals are a complementary digital signal pair, and
wherein the first and second analog audio signals correspond to right and left audio channels.

14. The method of claim 13,
wherein the communication port includes a USB port, and
wherein the multiplexing includes multiplexing the complementary digital signal pair to connectors of the communication port when the communication port operates in USB mode and multiplexing the right and left audio channels to the connectors of the communication port when operating the USB port in an audio mode.

* * * * *